United States Patent
Liu et al.

(10) Patent No.: US 10,879,084 B2
(45) Date of Patent: Dec. 29, 2020

(54) MOLDED PACKAGE

(71) Applicant: KONINKLIJKE PHILIPS N.V., Eindhoven (NL)

(72) Inventors: Yun Liu, Shanghai (CN); Yuhua Lee, Shanghai (CN); Chengsheng Ku, Shanghai (CN); Chingming Liu, Shanghai (CN); Mengming Zhu, Shanghai (CN); Dusan Golubovic, Shanghai (CN); Yujie Huang, Shanghai (CN)

(73) Assignee: Koninklijke Philips N.V.

( * ) Notice: Subject to any disclaimer, the term of this patent is extended or adjusted under 35 U.S.C. 154(b) by 0 days.

(21) Appl. No.: 16/828,618

(22) Filed: Mar. 24, 2020

(65) Prior Publication Data

US 2020/0227282 A1    Jul. 16, 2020

Related U.S. Application Data

(62) Division of application No. 15/517,725, filed as application No. PCT/EP2015/073134 on Oct. 7, 2015, now Pat. No. 10,629,456.

(30) Foreign Application Priority Data

Oct. 13, 2014  (WO) ............... PCT/CN2014/000900
Oct. 31, 2014  (EP) .................................. 14191281

(51) Int. Cl.
  *H01L 21/56*    (2006.01)
  *H01L 23/31*    (2006.01)
  (Continued)

(52) U.S. Cl.
  CPC ........ *H01L 21/565* (2013.01); *H01L 23/3178* (2013.01); *H01L 33/486* (2013.01); *H01L 33/54* (2013.01); *B29C 45/14418* (2013.01); *B29C 45/14655* (2013.01); *H01L 33/60* (2013.01); *H01L 2224/48091* (2013.01); *H01L 2224/48247* (2013.01); *H01L 2924/12041* (2013.01);
  (Continued)

(58) Field of Classification Search
  CPC .. H01L 21/565; H01L 23/3178; H01L 33/486
  See application file for complete search history.

(56) References Cited

U.S. PATENT DOCUMENTS

| 5,927,505 A | 7/1999 | Chia et al. |
| 2013/0037837 A1* | 2/2013 | Kang ............ H01L 24/97 257/98 |

FOREIGN PATENT DOCUMENTS

| EP | 1276143 A2 | 1/2003 |
| JP | 3472450 B2 | 3/1999 |

(Continued)

OTHER PUBLICATIONS

Communication pursuant to Article 94(3) EPC dated Dec. 18, 2018, European Patent Application No. 15775701.4, 6 pages.

(Continued)

*Primary Examiner* — Jacob T Minskey
*Assistant Examiner* — Melody Tsui

(57) ABSTRACT

A package is manufactured by placing a substrate, for example a lead frame, in a mold with a protection flange extending into a notch in the substrate around a contact surface. The protection flange impedes molding compound from reaching the contact surface reducing the need for a deflash step.

8 Claims, 3 Drawing Sheets

(51) Int. Cl.
*H01L 33/48* (2010.01)
*H01L 33/54* (2010.01)
*H01L 33/60* (2010.01)
*B29C 45/14* (2006.01)

(52) U.S. Cl.
CPC .............. *H01L 2933/005* (2013.01); *H01L 2933/0033* (2013.01); *H01L 2933/0058* (2013.01)

(56) References Cited

FOREIGN PATENT DOCUMENTS

| JP | 11087780 A | 3/1999 |
|---|---|---|
| JP | 2002232017 A | 8/2002 |
| JP | 2004127962 A | 4/2004 |
| JP | 2004259901 A | 9/2004 |

OTHER PUBLICATIONS

EPO as ISA, "International Search Report and Written Opinion" dated Feb. 9, 2017 from International Application No. PCT/EP2015/073134, filed Oct. 7, 2015, 11 pages.
Extended European Search Report dated Apr. 29, 2015, European Application No. 14191281.6, 5 pages.
First Office Action dated Dec. 4, 2018, China Patent Application No. 201580055617.6, 17 pages.
Group 11 Elements (https://web.archive.org/web/20121228064028/https://en.wikipedia.org/wiki/Group_11_element, Dec. 28, 2012) (year: 2012).
JP 2017-538290, "Office Action," dated Nov. 19, 2019, 9 pages.
Second Office Action dated Aug. 13, 2019, Chinese Patent Application No. 201580055617.6, 13 pages.

* cited by examiner

MOLDED PACKAGE

CROSS-REFERENCE TO RELATED APPLICATIONS

The present application is a divisional of U.S. patent application Ser. No. 15/517,725, filed Apr. 7, 2017, entitled "MOLDED PACKAGE AND METHOD OF MANUFACTURE," which is a § 371 application of International Application No. PCT/EP2015/073134 filed on Oct. 7, 2015 and entitled "MOLDED PACKAGE AND METHOD OF MANUFACTURE", which claims the benefit of International Application No. PCT/CN2014/000900 filed on Oct. 13, 2014 and European Patent Application No. 14191281.6 filed on Oct. 31, 2014. U.S. patent application Ser. No. 15/517,725, International Application No. PCT/EP2015/073134, International Application No. PCT/CN2014/000900, and European Patent Application No. 14191281.6 are incorporated herein.

FIELD OF THE INVENTION

The invention relates to a method of manufacturing a package, a package, and a packaged device using the package.

BACKGROUND OF THE INVENTION

Semiconductor devices may be packaged in a number of different ways. One approach that is used is to place a substrate in a mold having a mold cavity and then to inject molding compound into the cavity to form the package.

The substrate may in particular be a lead frame. This approach can result in a low cost package. Such low cost packages may be used in a number of applications, for example to mount light emitting diodes, LEDs.

A problem can however occur in the molding process. Molding compound can get between narrow gaps between the substrate and the mold and coat the substrate in locations where molding compound gives rise to disadvantages. In particular, if molding compound is present on a device mounting surface or bond pad the adhesion of a device to the device mounting surface or the bond to a bond pad can be impaired.

For this reason, a step known as "deflash" may be provided after the molding step to remove molding compound from regions where it is not required. However, this deflash step is an additional step which costs time and therefore money. It would therefore be beneficial if the need for such a deflash step could be reduced or eliminated.

US 2013/0037837 A1 discloses an optical device including a leadframe, a light source mounted to an attach pad of the leadframe, notches in the leadframe and a reflector cup around the attach pad and the notches. Also a method is disclosed.

SUMMARY OF THE INVENTION

The invention is defined by the claims.

According to an aspect, there is provided a method of manufacture of a package, comprising:
providing a substrate having a contact surface and a notch extending into the substrate around the contact surface;
providing a mold having a protection flange;
placing the substrate in the mold with the protection flange extending into the notch; and
filling the mold with molding compound, the protection flange impeding the flow of the molding compound to the contact surface.

By providing a protection flange around the contact surface during molding, a flow of molding compound between the mold and the contact surface may be impeded. In conventional package molding approaches, such molding compound on the contact surface is removed by a separate process step known as deflashing. The invention may reduce or eliminate the need for this deflashing process step.

Since a deflash step may reduce the adhesion of the remainder of the molding compound to the leadframe and may further reduce reflectivity, these disadvantages of the deflash step may be mitigated using the invention.

The invention is particularly useful for the formation of side walls, and in particular the mold may be shaped to form side walls having an inner surface facing the contact surface, the inner surface being at an angle of 25° to 90° to the contact surface, the angled inner surface extending into the notch. In embodiments, the side walls may shaped to an acute angle of 40° to 85° to the contact surface.

In an embodiment, the substrate is placed in the mold with the contact surface against the mold defining an interface between the mold and the contact surface with the protection flange extending in the notch around the complete circumference of the contact surface, the mold further defining a molding cavity adjacent to the substrate around the protection flange; and the step of filling the mold with molding compound fills the molding cavity with molding compound to form package walls, the protection flange blocking the molding compound from reaching the interface.

By providing the protection flange around the full circumference of the contact surface and against the interface between the mold and the contact surface an effective blocking of the mold material from the interface may be achieved.

In a particular embodiment, in the step of placing the substrate the substrate is placed such that:
the protection flange extends into the notch on the inner side of the notch adjacent to the contact surface; and
the molding cavity extends into the notch on the outer side of the notch spaced from the contact surface so that in the step of filling the mold with molding compound to form side walls the side walls extend into the notch.

The method may further include curing the molding compound to form a finished package ready for mounting a device.

The substrate may have a metal coating on the contact surface for mounting a device in a process that a step of forming the metal coating is prior to the step of placing the substrate in the mold. The metal coating on the substrate may extend as far as the notch and other area outside the notch.

The metal may be silver or copper, which are particularly effective conductors.

The substrate may be a lead frame.

The method of manufacture may further include mounting a device on a contact surface. The device may be a light emitting diode.

The method may further include encapsulating the device in an encapsulant.

In this way a finished package including a device may be manufactured.

Thus, the method relates both to forming a package ready for mounting a device as well as a package in its final state with a device mounted in the package.

Accordingly, in another aspect, there is provided a package, comprising:

a substrate having a contact surface and a notch extending around and below the contact surface; and side walls on the substrate above the substrate around the contact surface;

wherein the side walls have an inner surface facing the contact surface and extending into the notch.

The provision of a notch extending around the contact surface and below the level of the contact surface allows the method discussed above to be used. Thus, such a package may be manufactured with less need for a deflash step.

The package may further include a metal layer on the contact surface.

The metal layer may include a device mounting surface and one or more bond pads.

The invention also relates to a package including a device mounted on the contact surface.

An encapsulant may be provided around the device.

BRIEF DESCRIPTION OF THE DRAWINGS

Examples of the invention will now be described in detail with reference to the accompanying drawings, in which.

The drawings are not to scale. Like or corresponding components are given the same reference numbers in the different figures and the explanation relating thereto is not necessarily repeated.

DETAILED DESCRIPTION OF THE EMBODIMENTS

Figure 1:
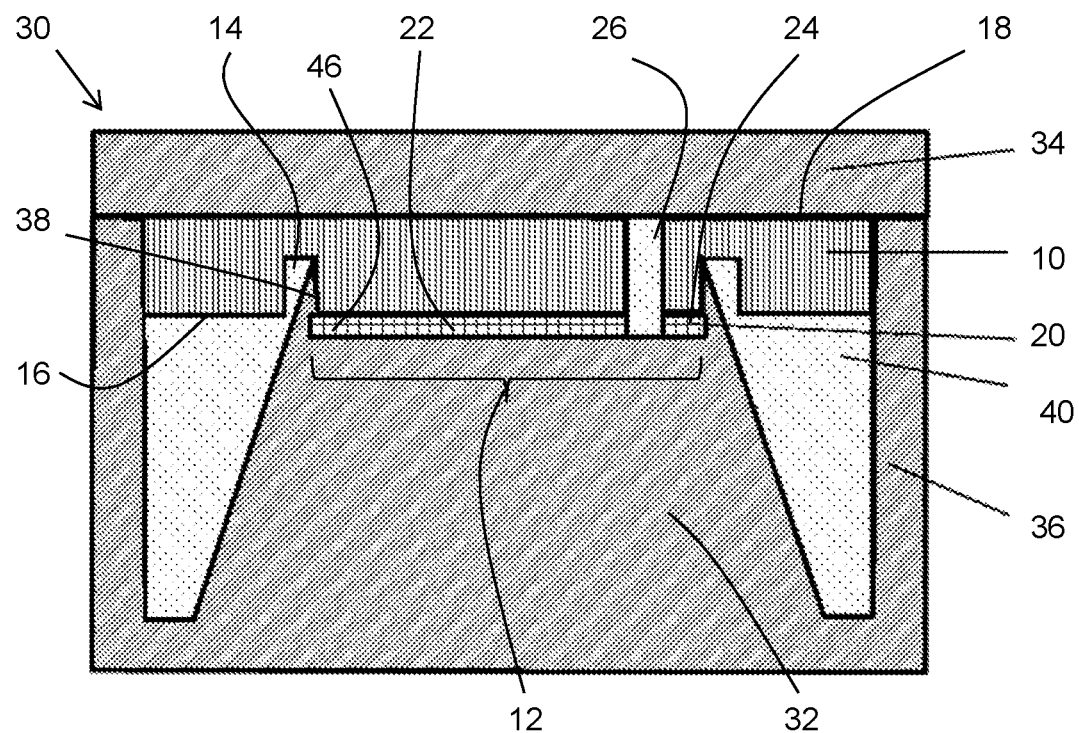
FIG. 1 shows a step in the manufacture of a package according to a first embodiment of the invention.

In a first embodiment of the invention, referring to FIG. 1, a substrate 10 in the form of a conductive lead frame of shaped metal has opposed first 16 and second 18 major surfaces. A contact surface 12 is provided on the first major surface and a notch 14 extends around the complete circumference of the contact surface extending from the first major surface towards the second major surface.

A metal coating 20 is provided on the contact surface 12. The metal coating may be for example iron, gold, nickel, palladium, silver or copper.

The contact surface is a surface of the substrate which contacts the device. Note that the contact surface 12 is not a single connected contact surface with a single connected metal coating 20. Instead, there are a number of gaps 26 in the contact surface 12 to allow the contact surface to provide a number of distinct contacts, including a device mounting surface 22 to which the device will be bonded in the finished device and a number of bond pads 24, only one being illustrated in FIG. 1. In the embodiment shown the gaps 26 are present in both the lead frame substrate 10 and the metal coating 20.

To form a package, the substrate 10 is placed in mold 30. The mold is formed of a first piece 32 and a second piece 34. The second major surface 18 of substrate 10 is placed against the second piece 34 of the mold. The first piece 32 is then placed to define a molding cavity 40 between the first piece 32 and the first major surface 16 of the substrate 10, with sidewalls 36 around the molding cavity 40 and with a protection flange 38 extending into the notch 14 of the substrate 10. The protection flange 38 hence extends into the substrate 10 past the metal coating 20 and the contact surface 12. Note that the protection flange 38 abuts the inner edge of the notch 14, the inner edge of the notch being the edge adjacent to the contact surface 12.

There will inevitably be a small gap at the interface 46 between the first piece 32 and the substrate 10 or metal coating 20, but this interface 46 is surrounded by the protection flange 38.

Molding compound is then injected into the molding cavity 40 under a predetermined pressure and temperature and solidified with heat to form package walls 42. Note that the molding compound also fills gaps 26. A cure at a predetermined temperature and time is then carried out. The formed package is then removed from the mold 30 (FIG. 2).

In this state, the package includes the substrate 10 with the package walls 42 having an inner surface 44 extending into notch 14. Note that the metal coating 20 of the device mounting surface 22 and the bond pad 24 is spaced from the inner surface 44 of the package walls 42.

In the embodiment shown, the inner surface 44 is angled at angle between 25° and 90° to the first major surface 16. Acute angles less than 90° can provide benefits in the finished device. In particular, angles of 40 to 70° can increase light output. However, for accomodating the largest devices, an angle of 90° would be appropriate.

Figure 2:
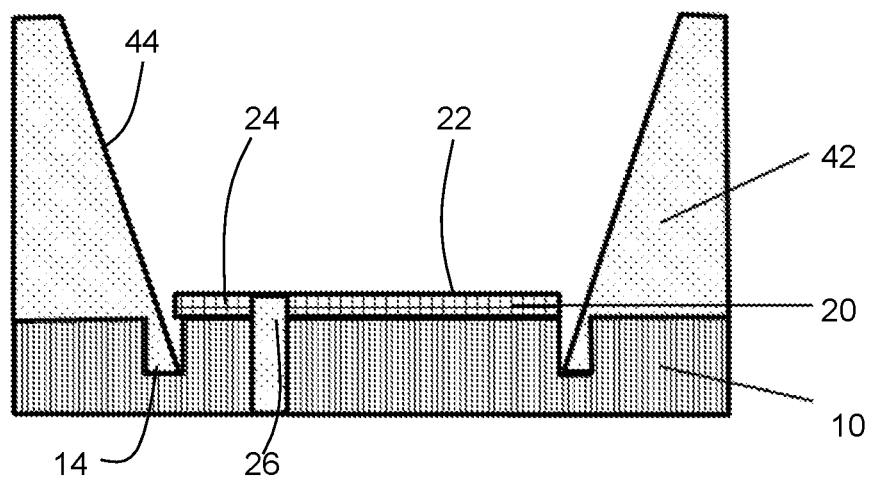
FIG. 2 shows a package manufactured in this way.
Figure 5:
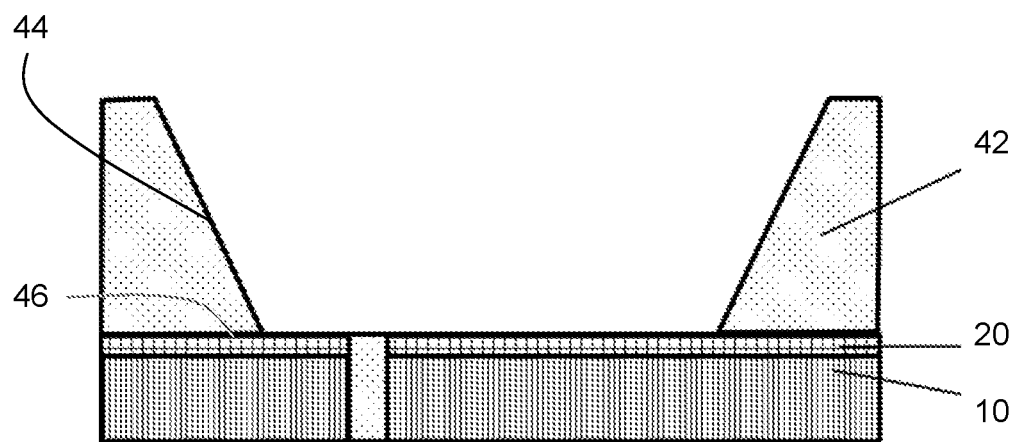
FIG. 5 shows a step in the manufacture of a comparative example.
Figure 6:
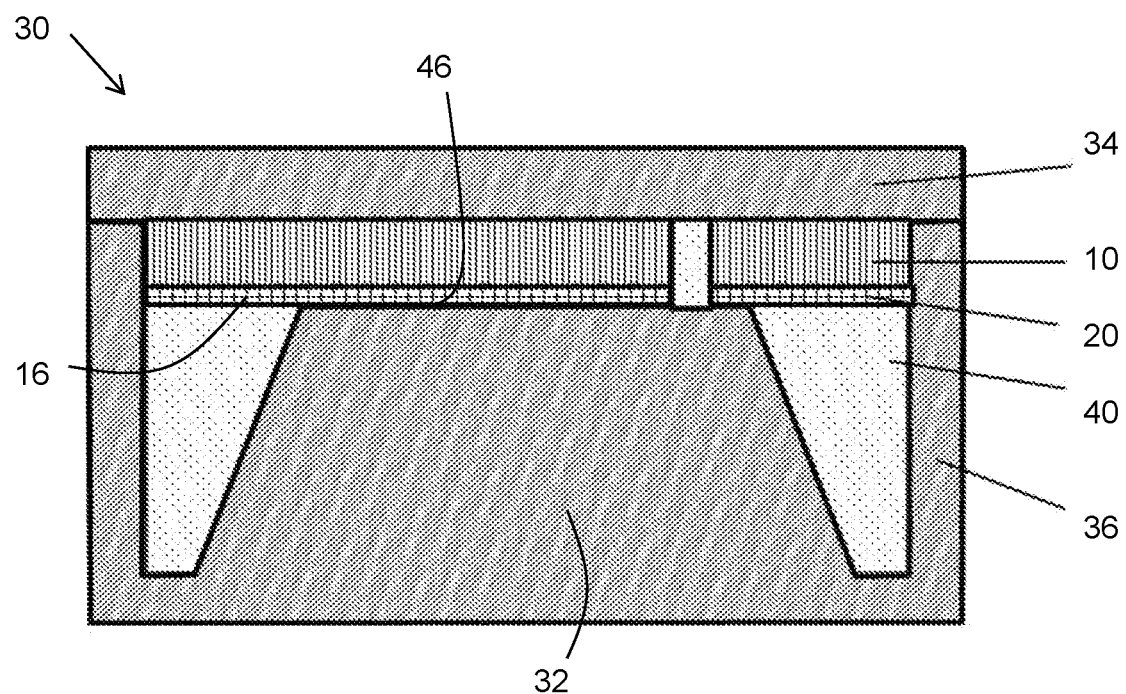
FIG. 6 shows a package manufactured according to the comparative example.

The process according to the embodiment of FIGS. 1 and 2 may be compared with a comparative example of FIGS. 5 and 6. The comparative example is the same as the embodiment except that the mold 30 in the comparative example omits the protection flange 38. Accordingly, the same reference numbers are used for like components in the comparative example and the description not repeated.

During the process according to the embodiment of FIGS. 1 and 2, molding compound is impeded or prevented from reaching the contact surface 12 by the protection flange 38 which extends between the molding cavity 40 and the contact surface 12.

In contrast, in the comparative example of FIGS. 5 and 6, even if the first piece 32 of the mold abuts the contact surface 12 or the metal coating 20, there remains a gap at the interface 46 which some molding compound enters under pressure. The molding compound will affect the reflectivity and thermal stability of the finished device.

Accordingly, in the comparative example an extra step is needed, namely a deflash step.

Thus, in the embodiment of FIGS. 1 and 2, the protection flange 38 blocks the interface 46 between the metal coating 22 and the first piece 32 of the mold 30. This impedes the molding compound from entering any gap at this interface 46 which in turn means that there is no need for a deflash step to remove molding compound.

Figure 3:
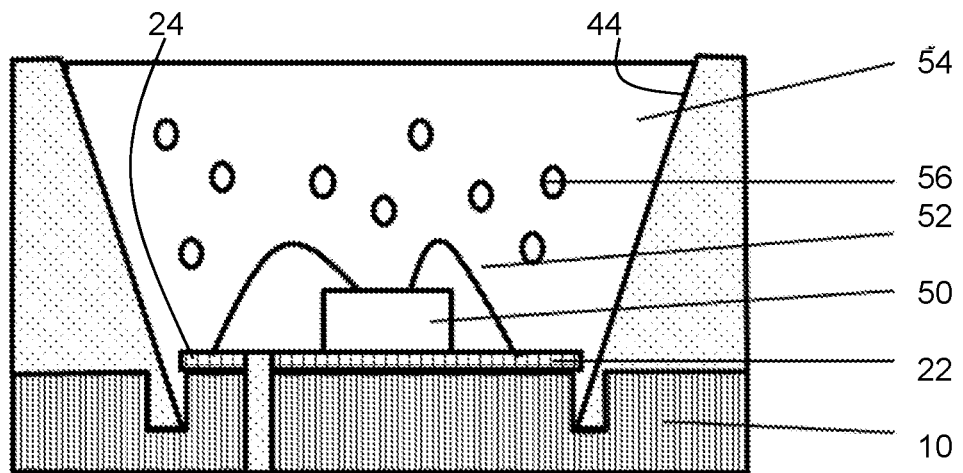
FIG. 3 shows a packaged device using the package of FIG. 2.

Returning to the first embodiment, the package of FIG. 2 may be used to prepare a packaged device as illustrated in FIG. 3. A device chip 50 is mounted onto the device mounting surface 22 in any known way. If required, bond wires 52 make connection to the bond pads 24 on substrate 10. Alternative bonding techniques such as for example flip chip bonding may also be used. Note that the device mounting surface 22 and bond pads 24 are protected from the intrusion of molding compound in the method of manufacturing the package as discussed above.

Then encapsulant 54, for example of silicone, is introduced into the package between sidewalls 36 of the mold 30 and covering the device chip 50. This encapsulant 54 also fills the empty part of notch 14.

The device chip 50 may in particular be a light emitting diode, LED. The packaged LED device may be used in lighting, for backlight, flash, automotive and display applications, or for traffic signals and the like.

In the embodiment of FIGS. 1 to 3, the inner surface 44 is angled at an acute angle less than 90° to the contact surface which provides an angled reflector for capturing light from the LED device 50 and directing it forwards out of the package.

Figure 4:
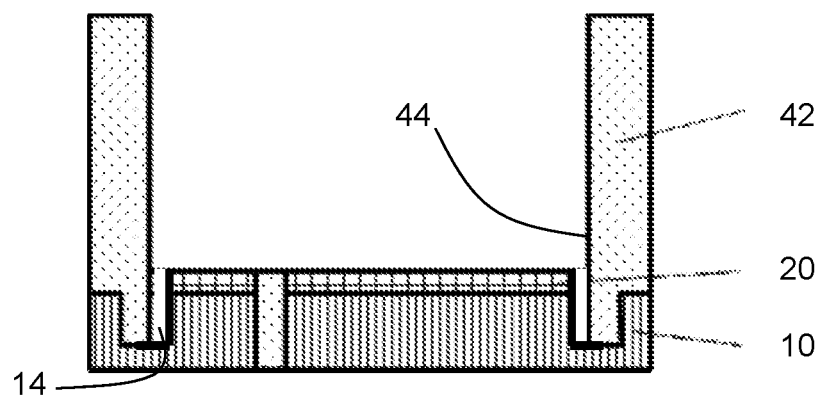
FIG. 4 shows a package according to a second embodiment of the invention.

In an alternative embodiment, illustrated in FIG. 4, the side walls 42 are vertical, i.e. at 90° to the contact surface 12 covered in metal coating 20. In this embodiment, the inner face 44 of the sidewall extends vertically from the edge of the notch 14 adjacent to the contact surface 12. The side wall 42 completely fills the notch.

Although the embodiments above use a lead frame as the substrate 10, the invention may also be applied to other substrate types. In an alternative example, the lead frame is replaced by a flexible substrate having metallisations. Further alternative examples may include the use of an inflexible substrate.

In the case where the substrate is insulating, not a conductive lead frame, it is possible to provide the gaps 26 only in the metallisation 20 and not in the substrate 10.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A package, comprising:
   a substrate having a contact surface and a notch,
   the notch extending around and below the contact surface and having an inner edge adjacent to the contact surface; and
   package walls on the substrate around the contact surface and around the notch, the package walls extending into the notch, extending away from the contact surface plane, and having an inner surface at an angle in a range of about 25° to about 90° to the contact surface, the inner surface of the package walls spaced apart from the inner edge of the notch and the contact surface.

2. The package according to claim 1, wherein the inner surface is at an angle in a range of about 25° to about 85° to the contact surface.

3. The package according to claim 1, wherein the inner surface is at an angle of 90° to the contact surface.

4. The package according to claim 1, further comprising a metal layer on the contact surface.

5. The package according to claim 1 further comprising a device mounted on the contact surface.

6. The package according to claim 5, further comprising an encapsulant around the device.

7. The package according to claim 1, wherein the substrate has a metal coating on the contact surface.

8. The package according to claim 7, wherein the metal coating comprises at least one of, iron, or gold, or nickel, or palladium, or silver, or copper.

\* \* \* \* \*